Jan. 8, 1963 A. G. T. BECKING ET AL 3,072,860

TRANSISTOR AMPLIFIER

Original Filed March 15, 1954

INVENTOR.
AUGUSTUS G.T. BECKING
PIETER BOXMAN

BY

Frank R. Jifani

AGENT

Patented Jan. 8, 1963

3,072,860
TRANSISTOR AMPLIFIER

Augustus Gerard Theodoor Becking and Pieter Boxman, Eindhoven, Netherlands, assignors, by mesne assignments, to North American Philips Company, Inc., New York, N.Y., a corporation of Delaware
Original application Mar. 15, 1954, Ser. No. 416,051, now Patent No. 2,801,297, dated July 30, 1957. Divided and this application Oct. 12, 1956, Ser. No. 618,164
Claims priority, application Netherlands July 18, 1953
1 Claim. (Cl. 330—23)

The present application is a division of U.S. patent application Serial No. 416,051, filed March 15, 1954, now U.S. Patent No. 2,801,297.

This invention relates to amplifier circuit arrangements. More particularly, the invention relates to transistor amplifiers comprising a transistor, a source of oscillations to be amplified, which is connected in series with a blocking capacitor between the base and the emitter of the transistor, and a supply connected in series with an impedance, having an important value for D.C. and for the oscillations to be amplified, between the emitter and the collector of the transistor.

Such amplifiers have the limitation that, particularly when using a comparatively low supply voltage and a comparatively high output impedance, the bias current variations of the transistor due to temperature variations may shift the working point and cause distortion of the oscillations to be amplified.

The present invention has for its purpose to mitigate the stated disadvantage. In accordance with the present invention, in order to stabilize the working point of the transistor, the lead connecting the base to the blocking capacitor, is connected via a coupling impedance to the lead connecting the collector to said output impedance.

Figure 1:
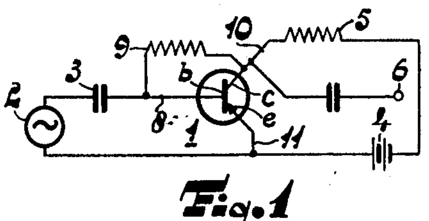
Figure 2:
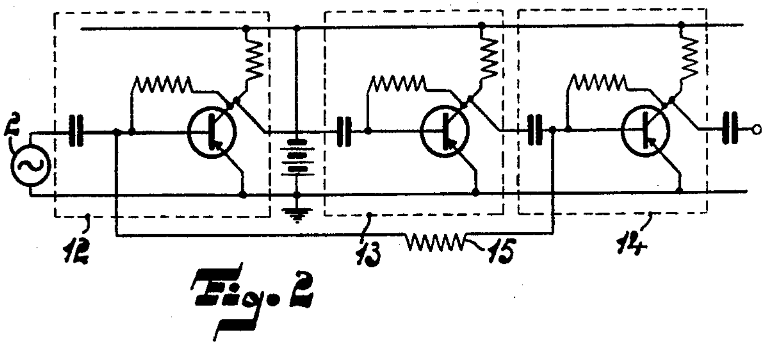

In order that the invention may be readily carried into effect it will now be explained in greater detail with reference to the accompanying drawing, in which:

FIG. 1 is a schematic diagram of an embodiment of the circuit arrangement of the present invention; and FIGS. 2, 3, 4 and 5 are modifications of the embodiment of FIG. 1.

In the modifications of FIGS. 2 to 5, the negative feedback, which occurs in the circuit-arrangement shown in FIG. 1 is reduced and possibly removed.

The amplifier shown in FIG. 1 which may, for example, be employed in hearing aids, comprises a transistor 1, preferably of the junction type, having a base *b*, an emitter *e* and a collector *c*. The signal oscillations from source 2, which are to be amplied, are supplied via a blocking capacitor 3 to the base *b*. A series combination of a voltage supply source 4 and an output impedance 5, across which are produced the amplified oscillations supplied to an output terminal 6, is connected between the emitter *e* and the collector *c*.

The source 4 supplies a comparatively low voltage of, say, 1.5 to 3 volts, and the resistor 5 has a comparatively high value of, say, several thousand ohms. Because of the large value of the resistor 5, a minute variation of the collector bias current produces a rather considerable variation of the collector bias voltage. The terms "bias current" and "bias voltage," establishing the so-called "working point" of the transistor, are to be understood to mean the current and voltage corresponding to signal oscillations of a value zero.

These variations of the collector bias voltage may be sufficiently large that the instantaneous value of the voltage across the output impedance 5 becomes substantially equal to the voltage of the source 4 when signal oscillations are applied to the input of the amplifier, in which case a considerable signal distortion tends to occur, because the instantaneous value of the voltage set up between the electrodes *e* and *c* then becomes equal to zero. Consequently it is vital to counteract said variation of the working point of the collector bias current.

According to the invention the lead 8, which connects the base *b* to the capacitor 3, is connected by way of a coupling impedance 9 to the lead 10 connecting the collector *c* to the output impedance 5. If the collector bias current through the output impedance 5 increases, for example due to temperature variations, this involves a decrease in base bias current passing through the impedance to the electrode *b*, since the voltage difference between the emitter and the base diminishes. Due to this, however, the said increase in collector bias current is counteracted. Upon calculation it is found that the remaining increase in collector bias current is approximately $$1+\frac{\alpha' R_5}{R_9+R_5}$$

time as low as in the absence of the output impedance 5; $R_5$ and $R_9$ representing the resistance values of the impedances 5 and 9 respectively, and $\alpha'$ representing the current amplification factor between the collector and base currents at a constant collector voltage. In practice, a stabilization factor of approximately 3 is chosen and this may be achieved by selecting the value of the impedance $R_9$ to be several times as high as that of the impedance $R_5$.

In most cases the impedances 5 and 9 will be resistors. Alternatively, a series-combination of resistors and chokes may be employed. The resistance 9 may, if desired, have an important dependence on temperature.

Essentially the same stabilization effect is obtained by shifting the impedance 5 to a lead section (not shown) of the emitter circuit.

It is now found that the coupling impedance 9 (preferably a resistor) provides not only stabilization of the working point, but also a negative feed-back of the signal oscillations. In order to avoid an unduly high degree of negative feed-back while retaining the same degree of stability, the cascade-circuit shown in FIG. 2 comprises an odd number of transistor amplifiers 12, 13, 14, of which at least the transistor amplifier 14 corresponds to the amplifier shown in FIG. 1, the base of the last-mentioned transistor being connected via an impedance 15 (preferably a resistor) to that of the first transistor of the cascade, said impedance involving a positive feed-back of the amplifier to the effect counteracting said negative feed-back.

Figure 3:
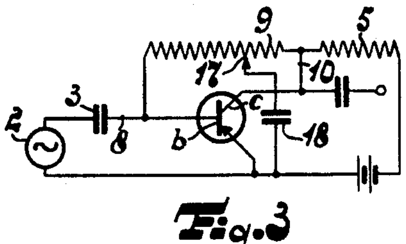

In FIG. 3, the negative feed-back is avoided by decoupling, by means of a decoupling capacitor 18, a tapping 17 on the impedance 9 (preferably a resistor) through which the lead section 10 is connected to the lead section 8.

Figure 4:
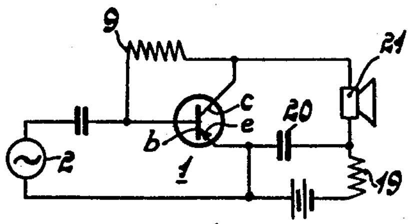

FIG. 4 shows a circuit arrangement, especially for use in hearing aids, in which the circuit between the emitter *e* and the collector *c* comprises the series-combination of a resistor 19, decoupled by a capacitor 20, and the coil of a loudspeaker or telephone 21. In this case, the impedance 9 connected between the collector *c* and the base *b* is again effective to stabilize the working point of the transistor without involving negative feed-back. If the value of the impedance 9 is made equal to $\alpha$ times the impedance of the coil, symmetrical limitation will occur in the transistor 1 on the occurrence of such strong signals from the source 2 as to overload the transistor 1, thus minimizing signal distortion.

Figure 5:
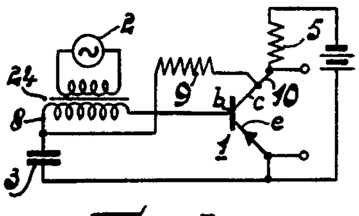

FIG. 5 shows a modification of the circuit-arrangement of FIG. 1, in which the source 2 is connected via a coupling transformer 24 in the circuit between the base *b* and the emitter *e* of the transistor 1, in series with the blocking capacitor 3 which is connected with one terminal to the emitter *e* instead of being connected to the base *b*. The D.C.-passing coupling impedance 9 again passes from the lead 8, which connects the base *b* and the capacitor 3, to the lead 10 connecting the collector *c* and the output impedance 5, thus again stabilizing the working point of the transistor. Since one terminal of the impedance 9 is connected to the lead portion between the transformer 24 and the capacitor 3, any negative feedback of the signal oscillations is obviated in practice.

While the invention has been described by means of specific examples and in specific embodiments, we do not wish to be limited thereto, for obvious modifications will occur to those skilled in the art without departing from the spirit and scope of the invention.

What is claimed is:

A stabilized transistor amplifier circuit, comprising a transistor having a base and a collector and an emitter, a direct current conductive source of signal voltage having a first terminal electrically connected to said base, a condenser connected in series between a second terminal of said source and the emitter, a single battery for the circuit, the battery and a load impedance being connected in series between said emitter and collector, said load impedance having direct current resistance, and a bias resistor having one end direct-current conductively connected to said second terminal and having its opposite end direct-current conductively connected to said collector between said collector and said load impedance, whereby the circuit is self-compensating for changes in collector current produced by variation of transistor parameters.

References Cited in the file of this patent

UNITED STATES PATENTS

| | | |
|---|---|---|
| 2,609,459 | Bergson | Sept. 2, 1952 |
| 2,750,456 | Waldhauer | June 12, 1956 |
| 2,762,873 | Goodrich | Sept. 11, 1956 |
| 2,762,875 | Fischer | Sept. 11, 1956 |
| 2,782,267 | Beck | Feb. 19, 1957 |
| 2,794,076 | Shea | May 28, 1957 |
| 2,801,296 | Blecher | July 30, 1957 |

FOREIGN PATENTS

| | | |
|---|---|---|
| 149,332 | Australia | Dec. 8, 1952 |

OTHER REFERENCES

Garner: Transistor Circuit Handbook, published by Coyne Electrical School, July 1956, page 55.